United States Patent [19]
Feucht

[11] 4,121,164
[45] Oct. 17, 1978

[54] AUTOMATIC TRIGGER CIRCUIT

[75] Inventor: Dennis LeRoy Feucht, Portland, Oreg.

[73] Assignee: Tektronix, Inc., Beaverton, Oreg.

[21] Appl. No.: 791,271

[22] Filed: Apr. 27, 1977

[51] Int. Cl.² ............................................. H03K 4/08
[52] U.S. Cl. ................................... 328/181; 307/228; 328/146; 328/207
[58] Field of Search ....................... 328/181, 146, 207; 307/228

[56] References Cited

U.S. PATENT DOCUMENTS

| | | | |
|---|---|---|---|
| 3,569,998 | 3/1971 | Eguchi | 307/228 |
| 3,577,012 | 5/1971 | Dummermuth | 328/181 X |
| 3,676,784 | 7/1972 | Le Comte | 328/181 |
| 3,851,262 | 11/1974 | Hohmann et al. | 328/181 X |
| 3,909,734 | 9/1975 | Palombo et al. | 328/181 |
| 3,971,923 | 7/1976 | Linder | 328/181 X |

Primary Examiner—John S. Heyman
Attorney, Agent, or Firm—George T. Noe

[57] ABSTRACT

An automatic trigger circuit for an oscilloscope includes a clock driven up-down counter and a digital-to-analog converter to automatically seek a suitable triggering level in the absence of an input triggering signal. When such level is established, the associated sweep generator is triggered, producing a display trace. Thereafter, the sweep generator is cyclically retriggered as the sweep "free runs."

3 Claims, 2 Drawing Figures

AUTOMATIC TRIGGER CIRCUIT

BACKGROUND OF THE INVENTION

Automatic trigger circuits for oscilloscopes have been in use for many years and are well known in the art under such names as "automatic time base," "bright baseline", and "peak-to-peak auto triggering". Such circuits in connection with a sweep generator typically provide a sweep that in the absence of a triggering signal free runs at a rate determined by its sweep rate and holdoff timing circuits. When a triggering signal is applied, the automatic triggering circuit reverts to a triggered mode in which time base sweep signals are produced in synchronism with the triggering signal.

Automatic triggering circuit schemes have included the use of triggerable free-running multivibrators, tunnel diode pulse generators, feedback systems, and logic circuits. Generally, such circuits are complex and require some knowledge of the circuit variables, such as input signal amplitude, voltage offset, triggering level adjustment, and slope control setting to attain a stable, recurrent display.

SUMMARY OF THE INVENTION

According to the present invention, an automatic trigger circuit for an oscilloscope provides for a triggered, stable display regardless of signal amplitude, input voltage offset, or trigger control settings.

A clock signal is applied to a gate which is normally inhibited during triggered sweep operation. In the absence of a triggering signal, or if the triggering signal is occurring at a rate less than a predetermined rate, the gate is enabled and the clock pulses pass to an up-down counter. The output of the counter is converted to an analog voltage in the form of a triangular waveshape. This voltage is summed with the trigger level voltage and applied to an associated trigger comparator reference input. Thus the reference input scans through the triggering signal dynamic range, or "triggering window", seeking a level at which triggering will occur. When the reference input of such comparator matches an input level applied to the other comparator input, a trigger signal is produced to initiate a sweep signal. The sweep gate signal which is produced simultaneously with the sweep signal is applied to a retriggerable monostable multivibrator, which in turn produces an inhibit signal to prevent further clock pulses from passing through the gate to the up-down counter, thereby stopping the counter at the triggering point. After a predetermined time period, the monostable multivibrator reverts to its stable condition, enabling the gate. The up-down counter then proceeds through a complete cycle, retriggering the sweep. The cycle continues to repeat as the sweep free runs so that a stable, flicker-free display is produced.

When an input triggering signal is applied, triggering is effected in the conventional manner, and the triggering level control may be adjusted to provide the desired triggering point. As long as the input triggering signal occurs at a rate faster than a predetermined rate, for example, 15 Hertz, the clock signal gate is inhibited and the up-down counter output remains constant.

The present invention may be utilized with some of the present automatic trigger circuit schemes, such as logic-controlled bright-baseline auto, snce the circuit of the present invention is implemented at the triggering level control rather than in subsequent sweep-control circuits. Thus the advantages of high-speed bright baseline auto may be combined with low speed stability in an automatic trigger generator.

It is therefore one object of the present invention to provide an automatic trigger generator in which a triggering level is automatically established within a triggering window.

It is another object to provide an automatic trigger circuit for an oscilloscope which provides a triggered, stable display regardless of signal amplitude, input voltage offset, or trigger control settings.

It is a further object to provide an automatic trigger circuit which can be used to augment a bright baseline auto circuit, thereby combining the features of high-speed bright baseline auto with low speed stability.

It is an additional object to provide an automatic trigger circuit which is simple and can be added as a modification to an existing circuit.

Other objects and attainments of the present invention will become apparent to those skilled in the art upon a reading of the following detailed description when taken in conjunction with the drawings.

DETAILED DESCRIPTION

Figure 1:
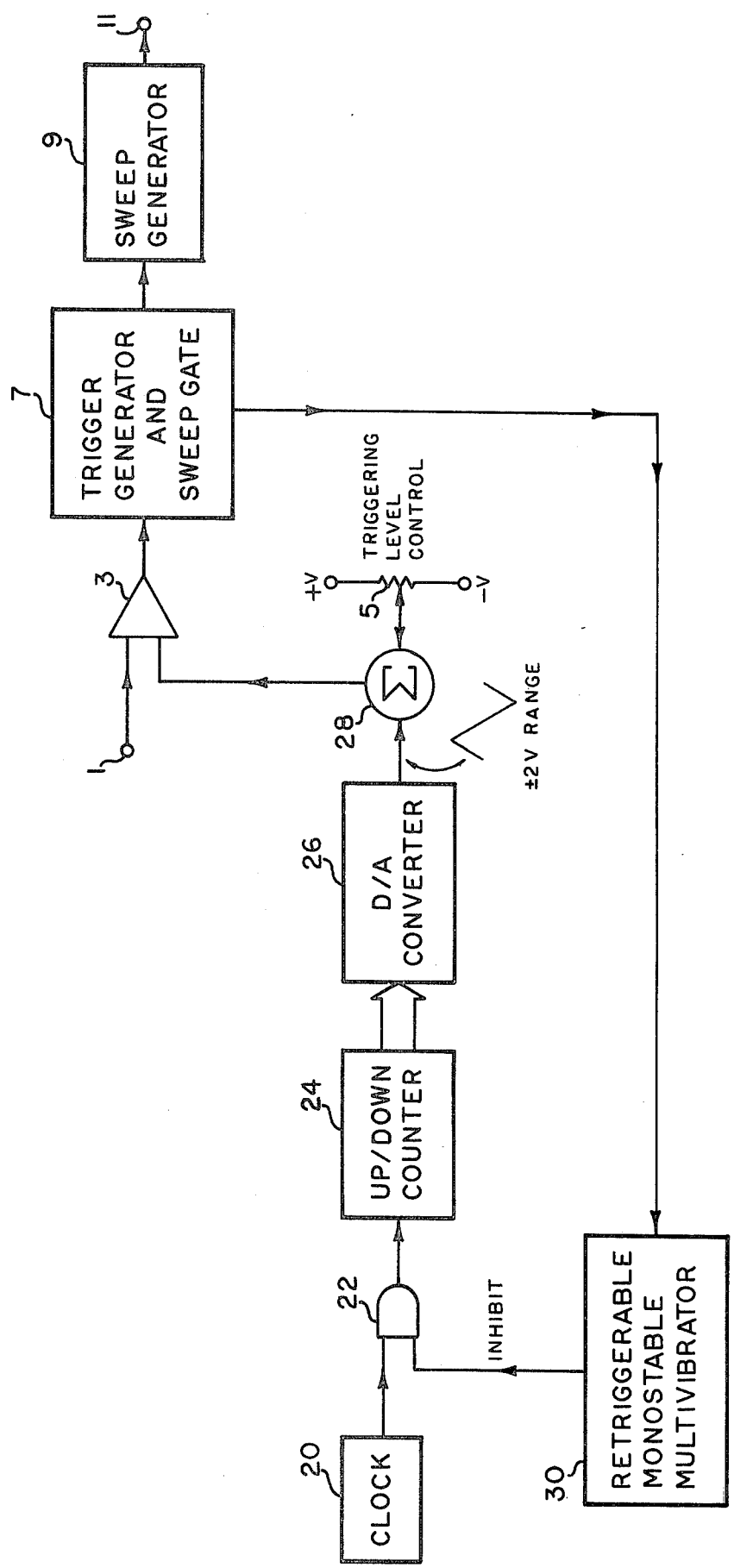
FIG. 1 shows an overall block diagram of an automatic trigger circuit in accordance with the present invention.

Referring to FIG. 1, the block diagram of an automatic trigger circuit is shown in its relationship to conventional trigger generator and sweep generator circuits of an oscilloscope. A triggering signal is applied via an input terminal 1 to a level comparator 3, which produces a trigger when the signal voltage passes through a level determined by a triggering level control 5. Comparator 3 may suitably be a commercially-available operational amplifier integrated circuit having + and − input terminals. Typically, a "triggering window" is established so that triggering is effected by input signals within a dynamic range whose limits are some voltage ± V about a particular reference, such as ground. Accordingly, the triggering level control 5 permits selecting a level within the dynamic range. Whether comparator 3 produces a trigger when the input signal is positive-going or negative-going as it passes through the triggering level is dependent upon which of the two comparator inputs the signal is applied to. Thus, slope selection is provided by merely switching the + and − inputs of comparator 3.

The trigger produced by comparator 3 is applied to a trigger generator circuit 7, which typically includes a multivibrator or sweep-gate logic circuitry. This circuitry accepts a trigger to initiate a sweep, and then locks out subsequent triggers until the sweep has terminated and all the sweep generating circuits have recovered to a stable quiescent condition. When the sweep is gated on by circuit 7, a sweep generator circuit 9 produces a linear ramp voltage which is available via a terminal 11 to subsequent horizontal amplifier and cathode-ray tube deflection plates. Sweep generator 9 typically comprises a Miller integrator.

The circuits discussed to this point are conventional and are well known in the art. The novel automatic trigger circuit will be described in conjunction with these conventional circuits.

Since the automatic trigger is going to operate in the absence of a triggering signal, or when the triggering signal is occurring at a rate less than a predetermined frequency, assume that terminal 1 is at some D.C. voltage level within the triggering window, for example, 0 volts.

Clock 20 produces a clock signal comprising square-wave pulses at some predetermined frequency. The clock signal is passed through an enabled AND gate 22 to an up-down counter 24. The count output data is then applied to a digital-to-analog converter 26. As long as the counter 24 counts clock pulses, the output of digital-to-analog converter 26 is a triangular voltage waveform, as shown in FIG. 1. This triangular waveform is applied to a summation circuit 28, where such voltage is summed with the voltage tapped from the triggering level control 5. The resultant voltage sum is then applied to the reference input of comparator 3.

As can be discerned, then, automatic triggering is effected by moving the reference input of comparator 3 with respect to the signal input, which is in a D.C. condition by virtue of the absence of an input signal. The triangular wave scans through the triggering window seeking the triggering point, which occurs when the voltage on the appropriate slope of the triangular wave matches the input level. A trigger is produced by comparator 3 and applied to trigger circuit 7, initiating a sweep. Simultaneously therewith, a sweep gate is applied to a retriggerable monostable multivibrator 30, whose output switches and inhibits AND gate 22, preventing further clock pulses from passing through the gate to the up-down counter, thereby stopping the counter at the triggering point. After a predetermined time period, the monostable multivibrator 30 reverts to its stable condition, enabling the gate 22. Up-down counter 24 then proceeds counting clock pulses through a complete cycle, retriggering the sweep. The aforementioned cycle continues to repeat to produce a free-running sweep.

The peak-to-peak amplitude of the triangular wave may suitably be at least twice the amplitude of the triggering window to ensure that at some portion of such triangular waveform will make complete positive-going and negative-going excursions through the triggering window regardless of the setting of the triggering level control.

When an input trigger signal appears at terminal 1, triggering is effected in the conventional manner. The triggering level control may be adjusted to provide the desired triggering level. As long as the input triggering signal occurs at a rate faster than a predetermined frequency, for example, 15 hertz, the gate 22 is inhibited and the up-down counter output remains constant.

Figure 2:
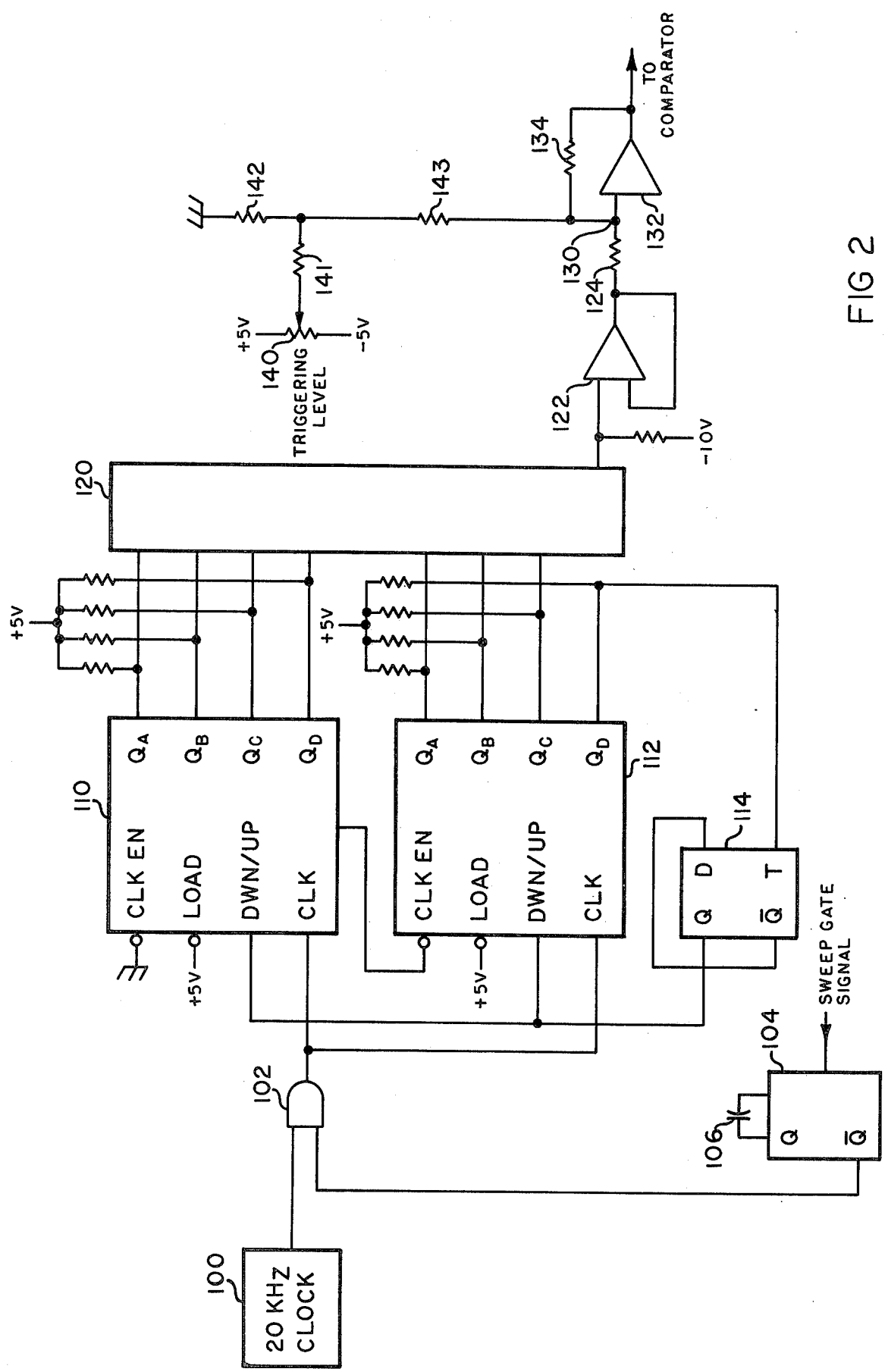
FIG. 2 shows a detailed schematic of the preferred embodiment according to the present invention.

FIG. 2 shows a detailed schematic of a preferred embodiment. A clock 100 produces pulses at a nominal frequency of 20 kilohertz, which clock pulses are applied to an AND gate 102. The passage of clock pulses through AND gate 102 is controlled by the Q output of monostable multivibrator 104. Multivibrator 104 may suitably be a commercially-available 74122 integrated circuit. An external discrete capacitor 106 is placed in parallel with an internal resistance to establish the multivibrator time constant. Quiescently, the Q output is high, enabling AND gate 102. When a sweep gate signal arrives at the input of multivibrator 104, the Q output is driven low, inhibiting AND gate 102 while the sweep runs. Capacitor 106 in the preferred embodiment was chosen to provide a Q inhibit gate duration of 25 milliseconds.

When AND gate 102 is enabled, the clock pulses pass therethrough and are applied to counters 110 and 112, which are connected in tandem to provide an 8-bit count output. These counters may suitably be commercially available 74LS191 synchronous up-down binary counters with mode controls for up- and down-count modes. The overflow output of counter 112 is utilized to toggle a D-type flip-flop 114, whose Q output is applied to the DWN/UP mode inputs of the counters 110 and 112. Thus, upon reaching overflow, the counters change up-down mode and begin counting in the opposite direction.

The 8-bit binary count output from counters 110 and 112 is applied to a digital-to-analog converter 120 to convert the count to a triangular voltage waveform. In the present circuit, an Allen-Bradley 316L08-1 100 kΩ R-2R Network was utilized to perform this function. The triangular voltage waveform is buffered by a voltage follower 122 and applied via resistor 124 to node 130, which is the null point of an inverting operational amplifier. The operational amplifier comprises amplifier 132 and feedback resistor 134, and performs the function of summing the triangular voltage waveform with the triggering level voltage from resistive network 140–143. The resistance values are chosen to provide the desired triggering level range and to ensure a signal which will scan through the aforementioned triggering window. The operational amplifier output is applied to one input of the trigger comparator.

The circuit of the present invention lends itself to be "modded in" to existing circuits because of its simplicity of design and minimal circuit connections, as well as being designed into new instruments. Further, the hereinabove described circuit is compatible with other auto triggering schemes and, for example, may be used to augment logic-controlled bright-baseline auto triggering to combine the advantages of both schemes, i.e., high-speed bright baseline and low-speed stability.

It will, therefore, be appreciated that the aforementioned and other desirable objects have been achieved; however, it should be noted that the particular embodiment of the invention, which is shown and described herein, is intended as merely illustrative and not as restrictive of the invention.

I claim:
1. An automatic trigger circuit, comprising:
a signal input;
a variable reference voltage source for providing a variably adjustable voltage level within a predetermined triggering voltage window;
a comparator having a first input terminal coupled to said signal input and a second input terminal coupled to said reference voltage source, said comparator generating triggering signals in response to a comparison between said signal input and said variably adjustable voltage level;
scanning means for causing said reference voltage automatically to scan through said triggering voltage window, said scanning means including means for generating a triangular voltage waveform the peak-to-peak amplitude of which is at least twice the peak-to-peak amplitude of said triggering voltage window, said scanning means further including means for summing said triangular voltage waveform with said variably adjustable voltage level to provide a scanning reference voltage; and control means for disabling said scanning means for a predetermined period of time after a triggering signal is generated.

2. An automatic trigger circuit in accordance with claim 1 wherein said means for generating a triangular voltage waveform comprises a clock which produces clock pulses at a predetermined rate, an up-down counter which counts said clock pulses and produces a count output therefrom, and a digital-to-analog converter which converts said count output to an analog voltage.

3. An automatic trigger circuit in accordance with claim 1 wherein said control means includes a monostable multivibrator which is responsive to said triggering signal to stop said scanning reference voltage at the level in said triggering window at which said triggering signal is generated.

* * * * *

UNITED STATES PATENT AND TRADEMARK OFFICE
CERTIFICATE OF CORRECTION

PATENT NO. : 4,121,164
DATED : October 17, 1978
INVENTOR(S) : DENNIS LeROY FEUCHT It is certified that error appears in the above–identified patent and that said Letters Patent are hereby corrected as shown below:

Col. 1, line 66, change "snce" to --s$\underline{i}$nce--.

Col. 3, line 28, change "gate is" to --gate $\underline{signal}$ is--.

Col. 3, lines 58, 63, 65, Col. 4, line 1, change "Q" to --$\bar{Q}$--.

Signed and Sealed this

Twenty-fourth Day of April 1979

[SEAL]

Attest:

RUTH C. MASON
Attesting Officer

DONALD W. BANNER
Commissioner of Patents and Trademarks